(12) United States Patent
Sung et al.

(10) Patent No.: US 11,515,255 B2
(45) Date of Patent: Nov. 29, 2022

(54) ELECTRO-MIGRATION BARRIER FOR INTERCONNECT

(71) Applicant: Taiwan Semiconductor Manufacturing Co., Ltd., Hsin-Chu (TW)

(72) Inventors: Su-Jen Sung, Zhubei (TW); Chih-Chiang Chang, Zhubei (TW); Chia-Ho Chen, Zhubei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/104,534

(22) Filed: Nov. 25, 2020

(65) Prior Publication Data

US 2021/0082831 A1 Mar. 18, 2021

Related U.S. Application Data

(60) Continuation of application No. 16/227,062, filed on Dec. 20, 2018, now Pat. No. 10,867,920, which is a
(Continued)

(51) Int. Cl.
*H01L 23/532* (2006.01)
*H01L 21/768* (2006.01)

(52) U.S. Cl.
CPC .. *H01L 23/53238* (2013.01); *H01L 21/76832* (2013.01); *H01L 21/76834* (2013.01); *H01L 21/76849* (2013.01); *H01L 21/76852* (2013.01); *H01L 21/76885* (2013.01); *H01L 23/5329* (2013.01); *H01L 2924/0002* (2013.01)

(58) Field of Classification Search
CPC ............ H01L 23/53238; H01L 23/532; H01L 23/5329
See application file for complete search history.

(56) References Cited

U.S. PATENT DOCUMENTS

| 4,970,574 A | 11/1990 | Tsunenari |
| 5,661,334 A | 8/1997 | Akram |

(Continued)

FOREIGN PATENT DOCUMENTS

| JP | 5021378 B2 | 9/2012 |
| KR | 20100072321 A | 6/2010 |

OTHER PUBLICATIONS

Non-Final Office Action dated Dec. 10, 2014 for U.S. Appl. No. 13/967,596.
(Continued)

*Primary Examiner* — Peniel M Gumedzoe
(74) *Attorney, Agent, or Firm* — Eschweiler & Potashnik, LLC

(57) ABSTRACT

The present disclosure relates to an integrated circuit having a conductive interconnect disposed on a dielectric over a substrate. A first liner is arranged along an upper surface of the conductive interconnect. A barrier layer is arranged along a lower surface of the conductive interconnect and contacts an upper surface of the dielectric. The barrier layer and the first liner surround the conductive interconnect. A second liner is located over the first liner and has a lower surface contacting the upper surface of the dielectric.

20 Claims, 5 Drawing Sheets

Related U.S. Application Data division of application No. 15/343,393, filed on Nov. 4, 2016, now Pat. No. 10,163,795, which is a continuation of application No. 13/967,596, filed on Aug. 15, 2013, now Pat. No. 9,490,209.

(60) Provisional application No. 61/778,674, filed on Mar. 13, 2013.

(56) References Cited

U.S. PATENT DOCUMENTS

| | | | |
|---|---|---|---|
| 5,801,100 | A | 9/1998 | Lee et al. |
| 6,020,263 | A | 2/2000 | Shih et al. |
| 6,020,273 | A | 2/2000 | Cheng et al. |
| 6,033,981 | A | 3/2000 | Lee et al. |
| 6,083,835 | A | 7/2000 | Shue et al. |
| 6,133,143 | A | 10/2000 | Lin et al. |
| 6,136,687 | A | 10/2000 | Lee et al. |
| 6,200,890 | B1 | 3/2001 | Chen |
| 6,461,225 | B1 | 10/2002 | Misra et al. |
| 6,475,901 | B2 | 11/2002 | Nishimura et al. |
| 6,566,250 | B1 | 5/2003 | Tu et al. |
| 6,645,859 | B1 | 11/2003 | Sawada et al. |
| 6,921,689 | B2 | 7/2005 | Matsuhashi |
| 7,666,781 | B2 * | 2/2010 | Hsu .................. H01L 21/76849 438/625 |
| 2003/0008495 | A1 | 1/2003 | Hsue et al. |
| 2003/0183940 | A1 | 10/2003 | Noguchi et al. |
| 2005/0087871 | A1 | 4/2005 | Abe |
| 2005/0147762 | A1 | 7/2005 | Dubin et al. |
| 2006/0027922 | A1 | 2/2006 | Lee et al. |
| 2007/0057374 | A1 | 3/2007 | McLaughlin et al. |
| 2007/0257369 | A1 | 11/2007 | Huang |
| 2008/0067679 | A1 | 3/2008 | Takagi et al. |
| 2008/0120580 | A1 | 5/2008 | Hsu et al. |
| 2009/0085145 | A1 | 4/2009 | Feustel et al. |
| 2010/0171220 | A1 | 7/2010 | Huang |
| 2011/0012238 | A1 | 1/2011 | Cohen et al. |
| 2012/0319279 | A1 | 12/2012 | Isobayashi |
| 2014/0252624 | A1 * | 9/2014 | Huang .............. H01L 23/53223 257/751 |

OTHER PUBLICATIONS

Final Office Action dated Jun. 19, 2015 for U.S. Appl. No. 13/967,596.
Non-Final Office Action dated Oct. 5, 2015 for U.S. Appl. No. 13/967,596.
Final Office Action dated Apr. 21, 2016 for U.S. Appl. No. 13/967,596.
Notice of Allowance dated Jul. 6, 2016 for U.S. Appl. No. 13/967,596.
Non-Final Office Action dated Apr. 24, 2017 for U.S. Appl. No. 15/343,393.
Final Office Action dated Nov. 2, 2017 for U.S. Appl. No. 15/343,393.
Non-Final Office Action dated Mar. 7, 2018 for U.S. Appl. No. 15/343,393.
Notice of Allowance dated Aug. 24, 2018 for U.S. Appl. No. 15/343,393.
Non-Final Office Action dated Oct. 4, 2019 for U.S. Appl. No. 16/227,062.
Final Office Action dated Apr. 16, 2020 for U.S. Appl. No. 16/227,062.
Non-Final Office Action dated Jun. 24, 2020 for U.S. Appl. No. 16/227,062.
Notice of Allowance dated Sep. 22, 2020 for U.S. Appl. No. 16/227,062.

* cited by examiner

ELECTRO-MIGRATION BARRIER FOR INTERCONNECT

CROSS-REFERENCE TO RELATED APPLICATIONS

This Application is a Continuation of U.S. application Ser. No. 16/227,062, filed on Dec. 20, 2018, which is a Divisional of U.S. application Ser. No. 15/343,393, filed on Nov. 4, 2016 (now U.S. Pat. No. 10,163,795, issued on Dec. 25, 2018), which is a Continuation of U.S. application Ser. No. 13/967,596, filed on Aug. 15, 2013 (now U.S. Pat. No. 9,490,209, issued on Nov. 8, 2016), which claims the benefit of U.S. Provisional Application No. 61/778,674, filed on Mar. 13, 2013. The contents of the above-referenced Patent Applications are hereby incorporated by reference in their entirety.

FIELD

The present disclosure relates to integrated circuit devices and methods for manufacturing them.

BACKGROUND

Many years of research have been devoted to reducing the critical dimensions (CDs) and structure densities of integrated circuits (ICs). As densities have increased, the resistance capacitance (RC) delay time has become a limiting factor in circuit performance. RC delay can be reduced by using copper in place of aluminum for metal interconnect structures. RC delay can also be reduced by using low-k or extremely low-k dielectrics.

Electro-migration can cause copper to diffuse into adjacent structures and create voids within copper lines. Electro-migration is typically mitigated using diffusion barriers. Diffusion barriers are generally provided between copper and adjacent structures. A variety of diffusion barrier materials have been used. Examples of conductive barrier materials include compounds of transition metals such as tantalum nitride, titanium nitride, and tungsten nitride. Examples of dielectric diffusion barrier materials include silicon nitride, silicon oxynitride, and silicon carbide.

DETAILED DESCRIPTION

The present disclosure provides integrated circuit devices and methods of forming them. The devices include a dielectric barrier layer formed over a copper-containing metal interconnect structure. The dielectric barrier layer inhibits electro-migration of Cu. The dielectric barrier layer includes a metal-containing layer that forms an interface with the copper-containing metal of the interconnect structure. Incorporating metal within the interfacial layer improves adhesion of the dielectric barrier layer to copper lines and the like and provides superior electro-migration resistance over the operating lifetime of the devices.

Figure 1:
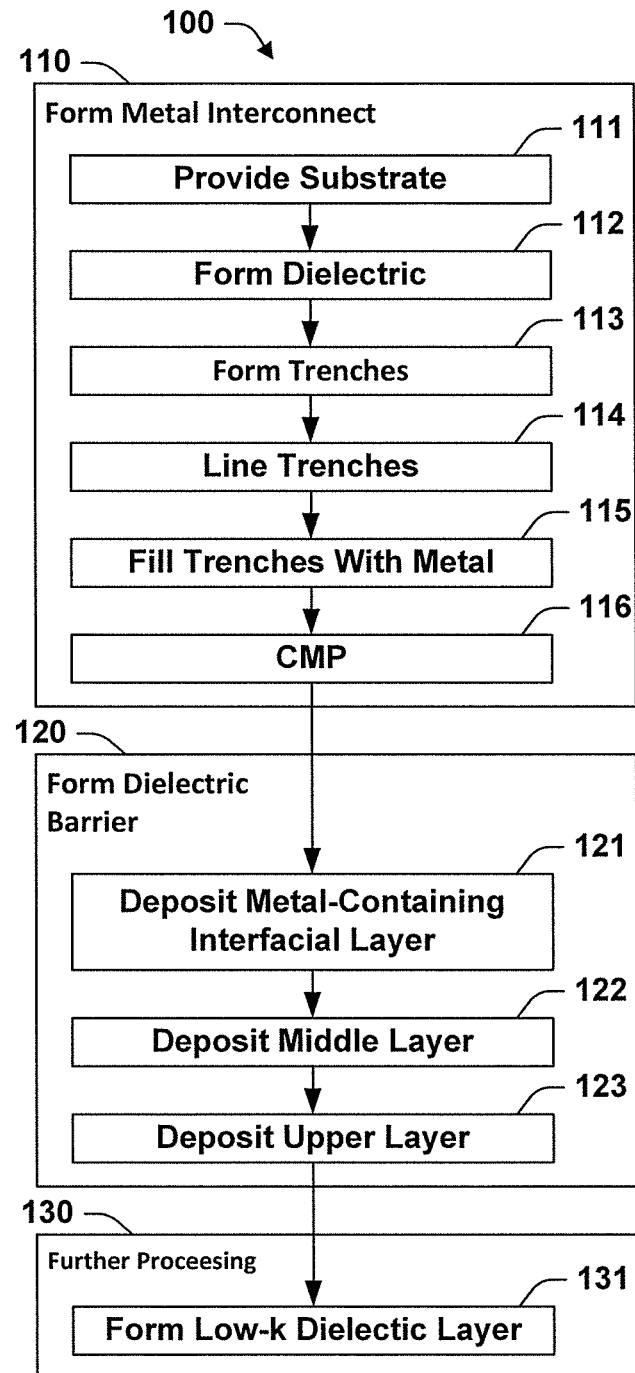
FIG. 1 is a flow chart of an example process according to an embodiment of the present disclosure.

FIG. 1 is a flow chart of an example process 100 according to an embodiment of the present disclosure. The process 100 begins with a series of actions 110 that form a metal interconnect with exposed copper-containing metal. The next series of actions 120 form a dielectric barrier layer over the exposed copper. Additional processing 130 can follow, and typically includes forming structures such as additional metal interconnect layers over the dielectric barrier layer.

Figure 2:
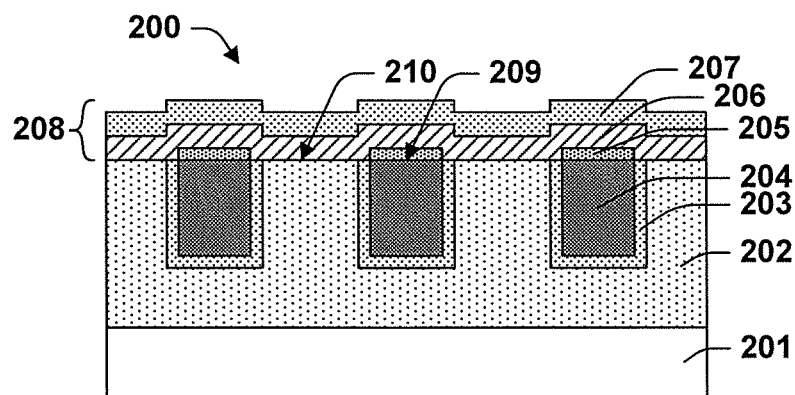
FIG. 2 is a schematic illustration of a semiconductor device according to an embodiment of the present disclosure.

FIG. 2 is a schematic illustration of an integrated circuit device 200, which is an embodiment of the present disclosure and an example of the type of device that can be produced by the process 100. The device 200 includes metal lines 204 formed within a matrix of dielectric 202. The dielectric 202 is formed over a substrate 201. Trench liner 203 provides a barrier between the conductive lines 204 and the dielectric 202. A dielectric barrier layer 208 is formed over the conductive lines 204. The dielectric barrier layer 208 includes a metal-containing interfacial layer 205, a middle layer 206, and an upper layer 207. In some embodiments, the middle layer 206 is not required and is excluded. In some embodiments, neither the middle layer 206 or the upper layer 207 is required, and both are excluded.

Figure 3:
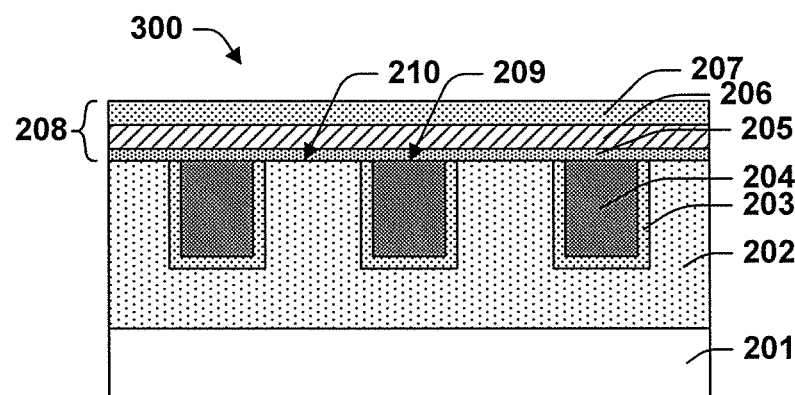
FIG. 3 is a schematic illustration of a semiconductor device according to another embodiment of the present disclosure.

In the device 200, the interfacial layer 205 has been formed by a selective deposition process, whereby the interfacial layer 205 is formed above the upper surface 209 of metal lines 204 but not above the upper surface 210 of dielectric 202. In some embodiments, the interfacial layer 205 is formed by a non-selective deposition process, whereby the interfacial layer 205 is formed above both the upper surface 209 of metal lines 204 and the upper surface 210 of dielectric 202. FIG. 3 is a schematic illustration of a integrated circuit device 300, which is an example of such embodiments.

Figure 4:
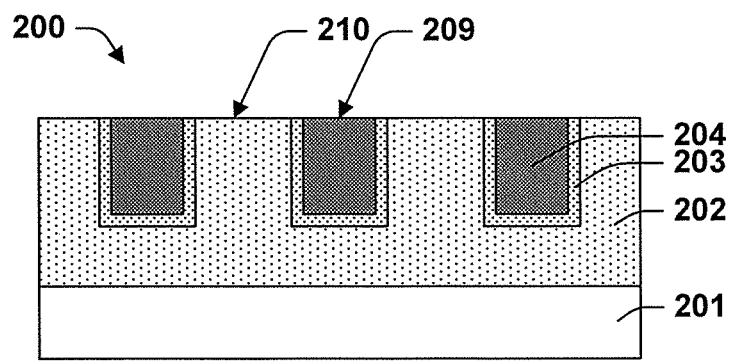
FIG. 4 is a schematic illustration of a semiconductor device including the interconnect structure used in the embodiments of FIGS. 2 and 3.

The metal interconnect can be formed by any suitable process. Suitable processes for forming the metal interconnect include, without limitation, damascene and dual damascene processes. The copper-containing metal 204 may be exposed at an intermediate stage of the damascene or dual damascene process. In the example process 100 illustrated by FIG. 1, the actions 110 that form a metal interconnect with exposed copper-containing metal 204 include: action 111, providing the substrate 201; action 112, forming a layer of dielectric 202 over the substrate 201; action 113, forming trenches within the dielectric 202; action 114, lining the trenches with trench liner 203; action 115, filling the trenches with copper-containing metal 204 to form metal lines; and action 116, planarization such as chemical mechanical polishing 116. FIG. 4 provides an example of the device 200 at this stage of manufacture.

Figure 5:
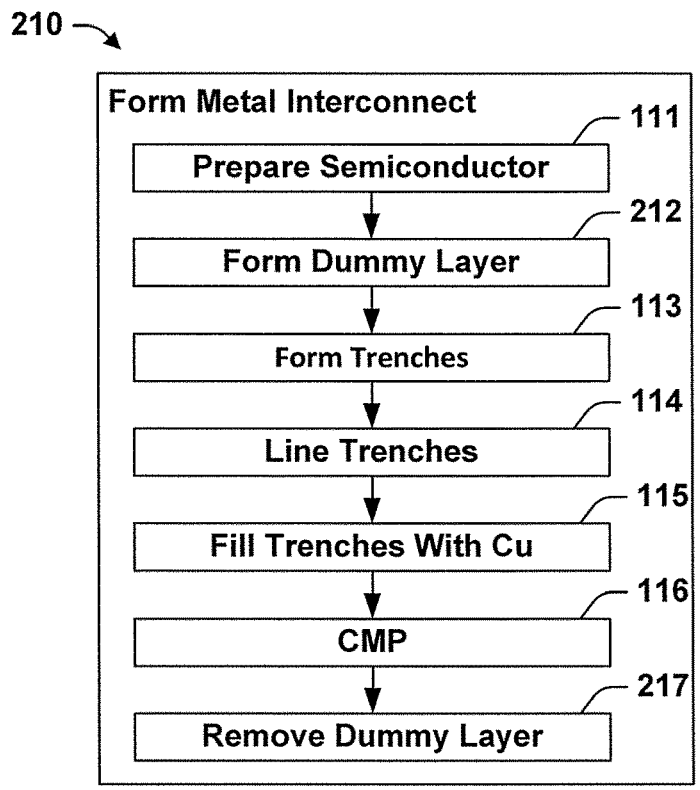
FIG. 5 is a flow chart of an alternate process as used in some other embodiments to form a metal interconnect structure.
Figure 6:
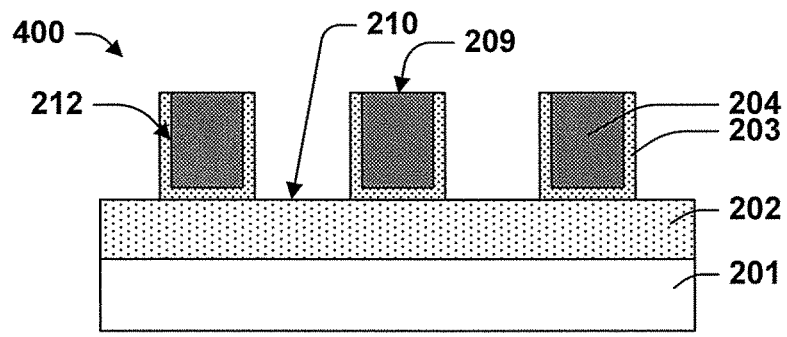
FIG. 6 is a schematic illustration of a semiconductor device including an example interconnect structure formed by the process of FIG. 5.
Figure 7:
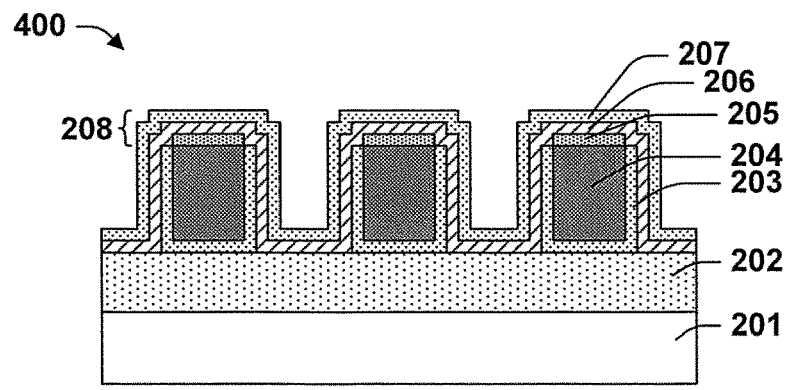
FIG. 7 is a schematic illustration of a semiconductor device according to some embodiments that use the interconnect structure of FIG. 6.
Figure 8:
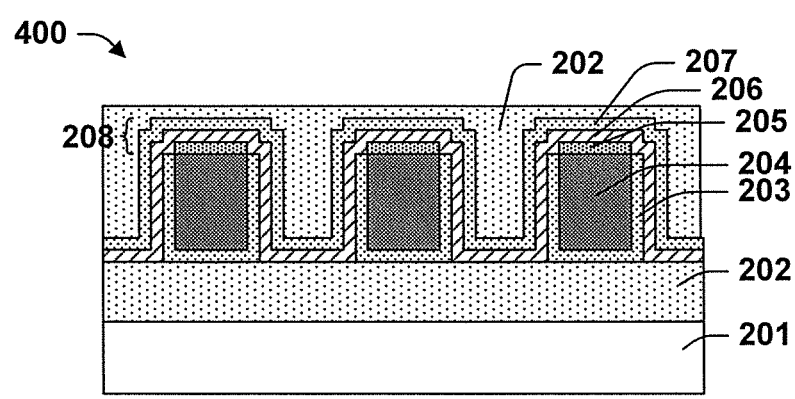
FIG. 8 is a schematic illustration of the semiconductor device of FIG. 7 after further processing.

FIG. 5 provides a flow chart for a process 210, which is another process that can be used for forming the metal interconnect. The process 210 is similar to the process 110 except for action 212, which forms a dummy layer that temporarily takes the place of all or part of the matrix of dielectric 202 within which conductive lines 204 are inlaid. The dummy layer is later removed with action 217. FIG. 6 provides a schematic illustration of a device 400 at the conclusion of process 210. FIG. 7 provides a schematic illustration of the device 400 after applying the process 120 to form the dielectric barrier layer 208. If the dielectric barrier layer 208 includes the upper layer 207 as illustrated in FIG. 7, the dielectric barrier layer 208 for the device 400 forms to the sides 212 as well as above the upper surface 209 of the conductive lines 204. As illustrated by FIG. 8, after further processing 130, the dielectric 202 forms a matrix within which conductive lines 204 are inlaid.

The process 210 of FIG. 5 is illustrative of embodiments in which metal lines 204 are formed before the surrounding matrix of dielectric 202. An advantage of forming the metal lines 204 first is avoiding damage or contamination of the surrounding dielectric 202 during processing that forms the metal lines 204. This can be particularly useful when the dielectric 202 includes an extremely low-k dielectric. Extremely low-k dielectrics are particularly susceptible to such damage or contamination.

Figure 9:
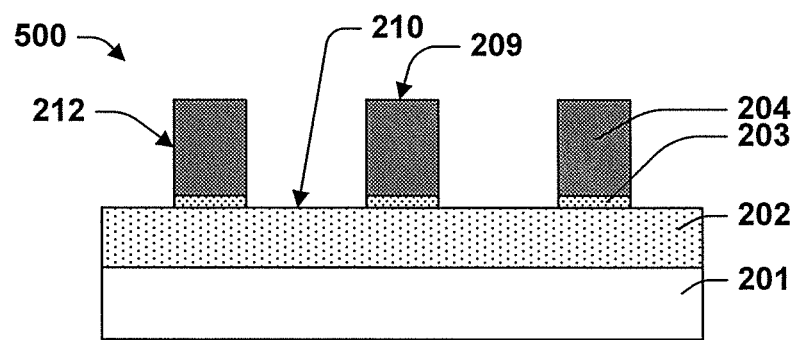
FIG. 9 is a schematic illustration of a semiconductor device including another example interconnect structure.
Figure 10:
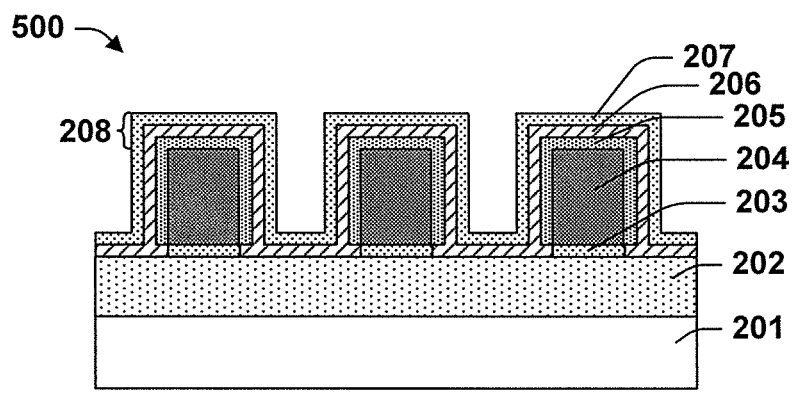
FIG. 10 is a schematic illustration of a semiconductor device according to some embodiments that use the interconnect structure of FIG. 9.
Figure 11:
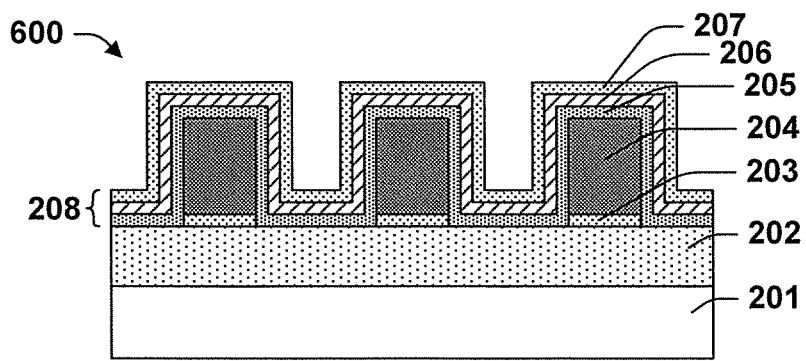
FIG. 11 is a schematic illustration of a semiconductor device according to some other embodiments that use the interconnect structure of FIG. 9.

Some embodiments employ a variation of process 210 in which lining the trenches, action 114, is skipped. FIG. 9 is a schematic illustration of a device 500 that provides an example of the resulting metal interconnect structure formed by this modified process 210. FIG. 10 provides an example of the resulting structure after applying the actions 120 that form the dielectric barrier layer 208 to the device 500 as illustrated in FIG. 9. The device 500 of FIG. 10 illustrates the case in which the interfacial layer 205 is formed by a selective deposition process 121. The device 600 illustrated by FIG. 11 illustrates the case in which the interfacial layer 205 is formed by a non-selective deposition process 121. In either case, the interfacial layer 205 forms to the sides 212 as well as on the upper surface 209 of the conductive lines 204. This can be advantageous when the dielectric barrier layer 208 provides superior resistance to electro-migration as compared to the trench liner 203.

The process 120 of forming the dielectric barrier layer 208 in FIG. 1 begins with action 121, forming the interfacial layer 205. In some embodiments, action 121 is a selective deposition process. In other embodiments, action 121 is a non-selective deposition process. In the present context, selective or non-selective is in relation to the exposed surfaces of copper-containing metal 204. Although the interfacial layer 205 contains metal, the interfacial layer 205 can be a dielectric. When the interfacial layer 205 is deposited by a non-conformal deposition process, a dielectric quality for the interfacial layer 205 is desirable to prevent bridging between conductive lines 204.

The composition of the interfacial layer 205 is selected to provide good adhesion to copper-containing metal lines 204 and stable protection against electro-migration. These properties can be provided by a composition having the formula $M_xO_yN_z$ where M is a metal, O is oxygen, and N is nitrogen. Generally, the metal is selected from the group consisting of Al, Mn, Co, Ti, Ta, W, Ni, Sn, Mg, and combinations thereof. In some embodiments, the interfacial layer 205 is a dielectric, x is in the range from 20 to 70%, y is in the range from 0-80%, z is in the range from 0-80%, and the sum of y and z is at least 30%. In some embodiments in which the interfacial layer 205 is deposited conformally, x is in the range from 40-100%, y is in the range from 0-60%, and z is in the range from 0-60%. Specific examples for the composition of the interfacial layer 205 include Co and AlN.

The thickness of the interfacial layer 205 can be in the range from 5 Å to 100 Å. In embodiments where the dielectric barrier layer 208 does not include the upper layer 207, the thickness is typically in the range from 20 Å to 100 Å. In embodiments where the dielectric barrier layer 208 includes the upper layer 207, the thickness is typically in the range from 5 Å to 50 Å.

The interfacial layer 205 can be formed by any suitable process. Examples of suitable processes for selective deposition of the interfacial layer 205 include, without limitation, electroplating and electroless plating. Examples of suitable processes for non-conformal deposition of the interfacial layer 205 include, without limitation, physical vapor deposition (PVD), chemical vapor deposition (CVD), and sputtering. As a specific example, the interfacial layer 205 can be formed by plasma-enhanced chemical vapor deposition (PECVD).

The process 120 of forming the dielectric barrier layer 208 continues with action 122, forming the middle layer 206. In some embodiments, the middle layer 206 is excluded. In other embodiments, the middle layer 206 is included within the dielectric barrier layer 208 to improve overall performance of the dielectric barrier layer 208 in preventing electro-migration.

The middle layer 206 is a dielectric having a composition selected to provide an effective barrier to the diffusion of copper. Suitable compositions for the middle layer 206 include, for example, SiN, SiC, SiCO and SiCN. The thickness of the middle layer 206 is typically in the range from 10 Å to 200 Å.

The middle layer 206 can be formed by any suitable process. Examples of processes that can be suitable for forming the middle layer 206 include, without limitation, physical vapor deposition (PVD), chemical vapor deposition (CVD), and sputtering. As a specific example, the middle layer 206 can be formed by plasma-enhanced chemical vapor deposition (PECVD).

The process 120 of forming the dielectric barrier layer 208 continues with action 123, forming the upper layer 207. In some embodiments, both the middle layer 206 and the upper layer 207 are excluded. In embodiments that include the middle layer 206, the upper layer 207 is generally superior to the middle layer 206 in terms of suitability for functioning as an etch stop layer. In embodiments that do not include the middle layer 206, and in some other embodiments as well, the upper layer 207 is included within the dielectric barrier layer 208 to improve overall performance of the dielectric barrier layer 208 in preventing electro-migration.

The upper layer 207 is a dielectric. The composition of the upper layer 207 can be selected to provide an effective barrier to the diffusion of copper. The composition of the upper layer 207 can also be selected to provide an etch stop layer for use during further process 130. Suitable compositions for the upper layer 207 include, for example, SiN, SiC, SiCN, SiON, and SiCON. The thickness of the upper layer 207 is typically in the range from 50 Å to 500 Å. As a specific example, the upper layer 207 can be SiCN while the middle layer 206 is SiN.

The upper layer 207 can be formed by any suitable process. Examples of processes that can be suitable for forming the upper layer 207 include, without limitation, physical vapor deposition (PVD), chemical vapor deposition (CVD), and sputtering. As a specific example, the upper layer 207 can be formed by plasma-enhanced chemical vapor deposition (PECVD).

The process 100 continues with further process 130. Further processing can include any steps necessary to complete formation of the device 100. In some embodiments, further processing includes at least action 161, forming a low-k dielectric layer over the dielectric barrier layer 208. This can be the low-k dielectric layer 203 that forms a matrix within which the conductive lines 204 are inlaid or the dielectric matrix for another overlying metal interconnect layer. The dielectric barrier layer 208 can be functional to mitigate electro-migration of copper from conductive lines 204 into the overlying low-k dielectric.

Copper-containing metal 204 can be copper or a conductive copper alloy. In some embodiments, metal 204 is copper as that term is used for copper interconnects in the semiconductor industry. In that context, copper is a metal formed primarily of copper atoms, but can be copper that is alloyed, doped, or otherwise impure.

The substrate 201 can be any suitable substrate. In most embodiments, the substrate 201 includes a semiconductor. Examples of semiconductors include, without limitation, silicon, silicon on insulator (SOI), Ge, SiC, GaAs, GaAlAs, InP, GaN SiGe. In some embodiments, the substrate 201 includes device formed during front-end-of-line processing. Device structures that can be formed during FEOL processing include, without limitation, memory devices, logical devices, FETs and components thereof such as source regions, drain regions, and gate electrodes, active devices, passive devices, and combinations thereof. The substrate 201 can also include insulators, conductors, and interconnect structures, including structures formed during back-end of line (BEOL) processing.

The dielectric 203 can include one or more layers of low-k dielectrics. A low-k dielectric is a material having a dielectric constant lower than that of silicon dioxide. Examples of low-k dielectrics include organosilicate glasses (OSG) such as carbon-doped silicon dioxide, fluorine-doped silicon dioxide (otherwise referred to as fluorinated silica glass (or FSG), and organic polymer low-k dielectrics. Examples of organic polymer low-k dielectrics include polyarylene ether, polyimide (PI), benzocyclobutene, and amorphous polytetrafluoroethylene (PTFE). A low-k dielectric can be applied by any suitable means, including for example, spin coating or CVD.

An extremely low-k dielectric is a material having a dielectric constant of about 2.1 or less. An extremely low-k dielectric can be formed by deposition of a low-k dielectric in such a manner that it has porosity or air-gaps, whereby the effective dielectric constant of the composite including pores and air gaps is 2.1 or less.

The present disclosure describes an integrated circuit device including a substrate, a copper-containing conductive line formed above the substrate, and a dielectric barrier layer above and in contact with the copper-containing conductive line. The dielectric barrier layer includes an interfacial layer that forms the interface between the dielectric barrier layer and the copper-containing conductive line. The interfacial layer has an atomic fraction of metal that is at least 20%.

The present disclosure describes a method of forming an integrated circuit device. The method includes forming a copper-containing conductive line over a substrate and forming a dielectric barrier layer over the copper-containing conductive line. The dielectric barrier layer includes at least a lower layer that is in contact with the copper-containing conductive line. The dielectric barrier layer includes an interfacial layer that forms an interface between the dielectric barrier layer and the copper-containing conductive line. The interfacial layer has an atomic fraction of metal that is at least 20%.

In some embodiments, the present disclosure relates to an integrated circuit device. The integrated circuit device comprises a substrate, and a conductive metal interconnect line arranged within a dielectric material disposed over the substrate. An interfacial layer is in contact with an upper surface of the conductive metal interconnect line. An upper dielectric layer is arranged over the interfacial layer. A middle dielectric layer is arranged between the upper dielectric layer and the interfacial layer.

In other embodiments, the present disclosure relates to an integrated circuit device. The integrated circuit device comprises a conductive metal interconnect line arranged within an inter-level dielectric material. An interfacial layer extends over an upper surface of the conductive metal interconnect line, and a liner is arranged along one or more surfaces of the conductive metal interconnect line not contacting the interfacial layer. A second dielectric layer overlies the interfacial layer and the liner. A second inter-level dielectric material laterally surrounds the second dielectric layer.

In yet other embodiments, the present disclosure relates to an integrated circuit device. The integrated circuit device comprises a substrate, and a conductive metal interconnect line arranged within a dielectric material disposed over the substrate. An interfacial layer is in contact with an upper surface of the conductive metal interconnect line. The interfacial layer has a planar lower surface contacting the conductive metal interconnect line. A liner is arranged along one or more surfaces of the conductive metal interconnect line not contacting the interfacial layer.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. An integrated circuit, comprising:
   a conductive interconnect disposed on a dielectric over a substrate;
   an interfacial layer arranged along an upper surface of the conductive interconnect;
   a liner arranged along a lower surface of the conductive interconnect and contacting an upper surface of the dielectric, wherein the liner and the interfacial layer surround the conductive interconnect;
   a middle layer located over the interfacial layer and having a lower surface contacting the upper surface of the dielectric, wherein the middle layer extends to a lowermost surface of the liner; and
   wherein the middle layer comprises an upper surface that protrudes laterally outward from a bottom of a sidewall of the middle layer facing the conductive interconnect, the upper surface being laterally between the sidewall of the middle layer and a sidewall of the conductive interconnect.

2. The integrated circuit of claim 1, wherein the lowermost surface of the liner is contacting the upper surface of the dielectric.

3. The integrated circuit of claim 1, wherein the middle layer extends from over the conductive interconnect to below a bottommost surface of the conductive interconnect.

4. The integrated circuit of claim 1,
wherein the liner extends along a bottommost surface of the conductive interconnect; and
wherein the interfacial layer contacts sidewalls of the conductive interconnect and the upper surface of the middle layer.

5. An integrated circuit, comprising:
a conductive interconnect disposed over a substrate, wherein the conductive interconnect is directly above an uppermost surface of a dielectric;
an interfacial layer arranged along an upper surface of the conductive interconnect;
a liner arranged along a lower surface of the conductive interconnect, wherein the liner and the interfacial layer surround the conductive interconnect;
a middle layer disposed over the interfacial layer and along sidewalls of the conductive interconnect, wherein the middle layer completely covers an outermost sidewall of the liner; and
wherein the middle layer comprises a first sidewall and a second sidewall disposed along a same side of the conductive interconnect, the first sidewall facing the conductive interconnect and the second sidewall facing the liner, the second sidewall being laterally separated from the first sidewall by a non-zero distance.

6. The integrated circuit of claim 5, wherein the interfacial layer has interior sidewalls facing the conductive interconnect, the interior sidewalls being laterally outside of the liner.

7. The integrated circuit of claim 6, wherein the middle layer contacts a lower surface and an upper surface of the interfacial layer.

8. The integrated circuit of claim 5, further comprising:
a second conductive interconnect disposed over the substrate, wherein the middle layer has an upper surface that is laterally between the conductive interconnect and the second conductive interconnect, the upper surface being vertically below a bottom of the conductive interconnect.

9. The integrated circuit of claim 5, further comprising:
a second conductive interconnect disposed over the substrate, wherein the middle layer has a substantially constant thickness from over the conductive interconnect to over the second conductive interconnect.

10. The integrated circuit of claim 5, wherein the middle layer contacts a bottom of the interfacial layer.

11. The integrated circuit of claim 5, the interfacial layer has a greater maximum width than the liner.

12. The integrated circuit of claim 5, further comprising:
an inter-level dielectric (ILD) layer laterally surrounding the middle layer.

13. An integrated circuit, comprising:
a conductive interconnect arranged over a substrate;
an interfacial layer arranged along an upper surface of the conductive interconnect;
a liner arranged along a lower surface of the conductive interconnect, wherein the liner and the interfacial layer surround the conductive interconnect; and
a middle layer arranged over the interfacial layer, extending vertically past uppermost and lowermost surfaces of the conductive interconnect, and comprising a horizontally extending ledge coupled to an overlying vertically extending surface of the middle layer, wherein the horizontally extending ledge is over a top surface of the conductive interconnect.

14. The integrated circuit of claim 13, wherein the horizontally extending ledge has a first end coupled to the overlying vertically extending surface of the middle layer and a second end coupled to an underlying vertically extending surface of the middle layer as viewed along a cross-sectional view.

15. The integrated circuit of claim 13, wherein both the middle layer and a lower surface of the liner physically contact a flat upper surface of a dielectric.

16. The integrated circuit of claim 13, wherein the interfacial layer comprises an atomic fraction of metal that is at least about 20% and a combined atomic fraction of nitrogen and oxygen that is higher than the atomic fraction of metal.

17. The integrated circuit of claim 13, further comprising:
an inter-level dielectric (ILD) layer laterally surrounding and vertically overlying the middle layer.

18. The integrated circuit of claim 13, wherein the middle layer comprises a first lower surface and a second lower surface that both face the substrate and that both are directly above the liner.

19. The integrated circuit of claim 18, wherein the first lower surface contacts an upper surface of the interfacial layer and the second lower surface contacts an upper surface of the liner.

20. The integrated circuit of claim 13, wherein the middle layer has a height that is greater than a combined height of the conductive interconnect and the interfacial layer.

* * * * *